(12) United States Patent
Jakupi et al.

(10) Patent No.: US 11,079,424 B2
(45) Date of Patent: Aug. 3, 2021

(54) COMBINED LOW FREQUENCY AND HIGH FREQUENCY CURRENT SENSOR

(71) Applicant: SCHNEIDER ELECTRIC USA, INC., Andover, MA (US)

(72) Inventors: Andi Jakupi, Marion, IA (US); Robert Isaacson, Cedar Rapids, IA (US); Carlton R. Rodrigues, Mount Juliet, TN (US)

(73) Assignee: Schneider Electric USA, Inc., Andover, MA (US)

( * ) Notice: Subject to any disclaimer, the term of this patent is extended or adjusted under 35 U.S.C. 154(b) by 252 days.

(21) Appl. No.: 16/213,472

(22) Filed: Dec. 7, 2018

(65) Prior Publication Data
US 2020/0182921 A1 Jun. 11, 2020

(51) Int. Cl.
*G01R 31/12* (2020.01)
*G01R 15/20* (2006.01)
(Continued)

(52) U.S. Cl.
CPC ....... *G01R 31/1272* (2013.01); *G01R 15/202* (2013.01); *G01R 19/16571* (2013.01);
(Continued)

(58) Field of Classification Search
CPC .............. G01R 31/1272; G01R 15/202; G01R 19/16751; H01F 27/255; H02H 1/0007; H02H 3/10
See application file for complete search history.

(56) References Cited

U.S. PATENT DOCUMENTS

| 4,425,596 A | 1/1984 | Satou |
| 4,858,054 A | 8/1989 | Franklin |

(Continued)

FOREIGN PATENT DOCUMENTS

| EP | 0320341 A1 | 6/1989 |
| JP | 2014215103 A | 11/2014 |

(Continued)

OTHER PUBLICATIONS

Dalessandro L et al: "High-Performance Planar Isolated Current Sensor for Power Electronics Applications", IEEE Transactions on Power Electronics, Institute of Electrical and Electronics Engineers, USA. vol. 22, No. 5, Sep. 1, 2007, pp. 1682-1692, XP011191703, ISSN: 0885-8993, DOI: 10.1109/TPEL.2007.904198 *the whole document*.

(Continued)

*Primary Examiner* — Fred E Finch, III
*Assistant Examiner* — Kevin H Sprenger
(74) *Attorney, Agent, or Firm* — Locke Lord LLP

(57) ABSTRACT

Example embodiments of the invention include a powdered core bead body configured to become an inductive impedance to current signals in a power wire with high frequencies. The signals are detectable by a high frequency voltage sensor, which is configured to output an arc fault tripping indication to an arc fault tripping circuit. The bead body includes a magnetic flux-density sensing device embedded in an air cavity of the bead body, having a magnetic field sensing surface oriented substantially perpendicular to the circumferential periphery of the bead body. The bead body is configured to provide measurable magnetic flux through the magnetic flux-density sensing device, for currents in the power wire having low frequencies. The measurable magnetic flux is detectable by a low frequency magnetic flux-density sensing device, to output a low frequency current (Continued)

measurement for power metering devices or to determine power consumption within a protected branch.

14 Claims, 10 Drawing Sheets

(51) Int. Cl.
  G01R 19/165 (2006.01)
  H01F 27/255 (2006.01)
  H02H 1/00 (2006.01)
  H02H 3/10 (2006.01)
(52) U.S. Cl.
  CPC ......... H01F 27/255 (2013.01); H02H 1/0007 (2013.01); H02H 3/10 (2013.01)

(56) References Cited

U.S. PATENT DOCUMENTS

| | | | |
|---|---|---|---|
| 6,128,169 A | 10/2000 | Neiger et al. | |
| 6,426,634 B1 | 7/2002 | Clunn et al. | |
| 6,625,550 B1* | 9/2003 | Scott | H01H 71/125 361/63 |
| 8,599,523 B1* | 12/2013 | Ostrovsky | G08B 21/185 361/45 |
| 2005/0073295 A1* | 4/2005 | Hastings | G01R 15/202 324/117 R |
| 2006/0214668 A1 | 9/2006 | Mernyk et al. | |
| 2012/0319489 A1* | 12/2012 | McCaslin | H02H 7/20 307/77 |
| 2014/0357126 A1* | 12/2014 | Suzuki | G01R 15/207 439/620.01 |
| 2015/0219692 A1 | 8/2015 | Krah et al. | |
| 2016/0072271 A1* | 3/2016 | Packard | H02H 9/041 361/42 |
| 2017/0117699 A1 | 4/2017 | Ostrovsky et al. | |
| 2018/0287368 A1* | 10/2018 | Butti | G01R 31/1272 |

FOREIGN PATENT DOCUMENTS

| | | |
|---|---|---|
| KR | 20140125585 A | 10/2014 |
| KR | 101454203 B1 | 11/2014 |

OTHER PUBLICATIONS

European Search Report for related Application No. 19213921.0-1010 dated Apr. 28, 2020.

* cited by examiner

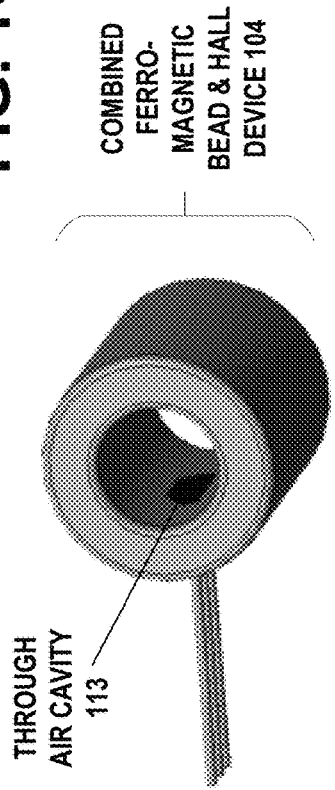
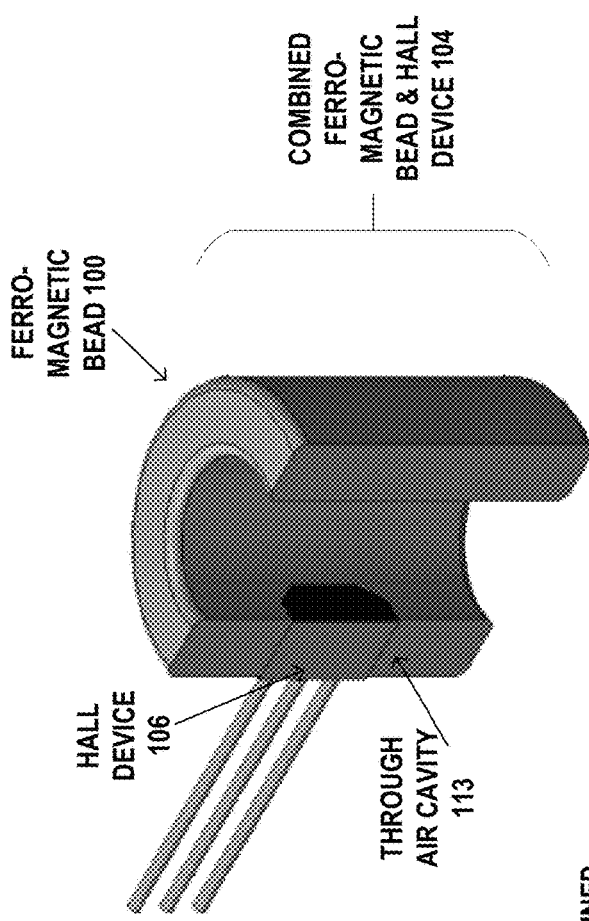
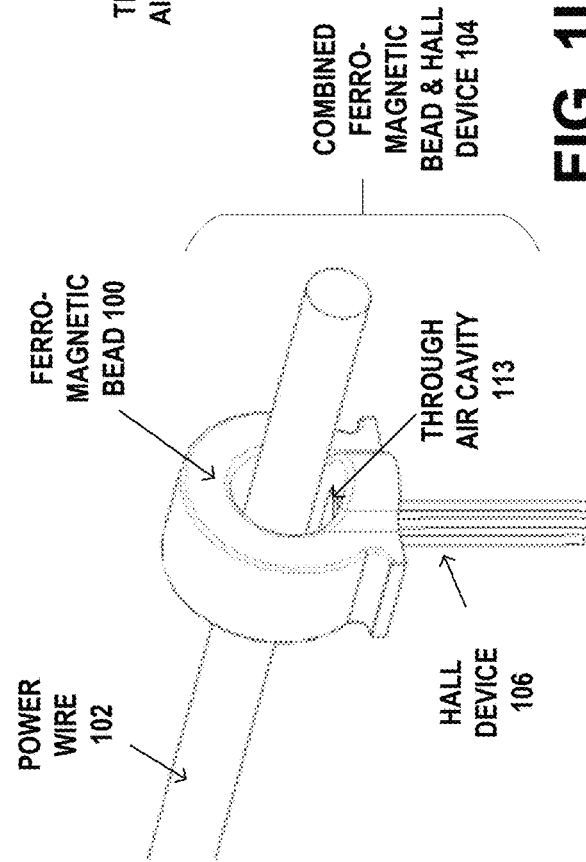

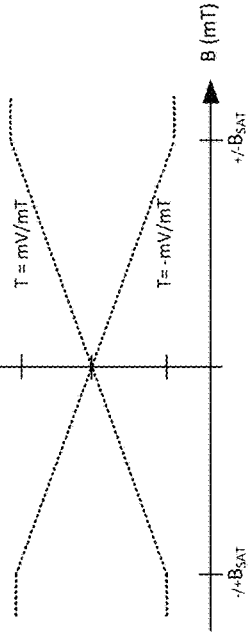
FIG. 4C
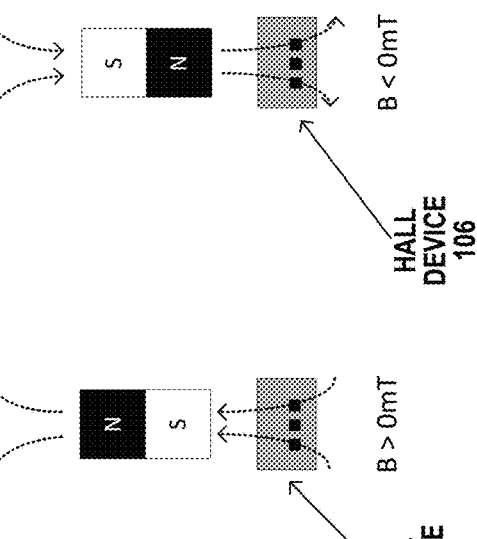
FIG. 4B
FIG. 4A
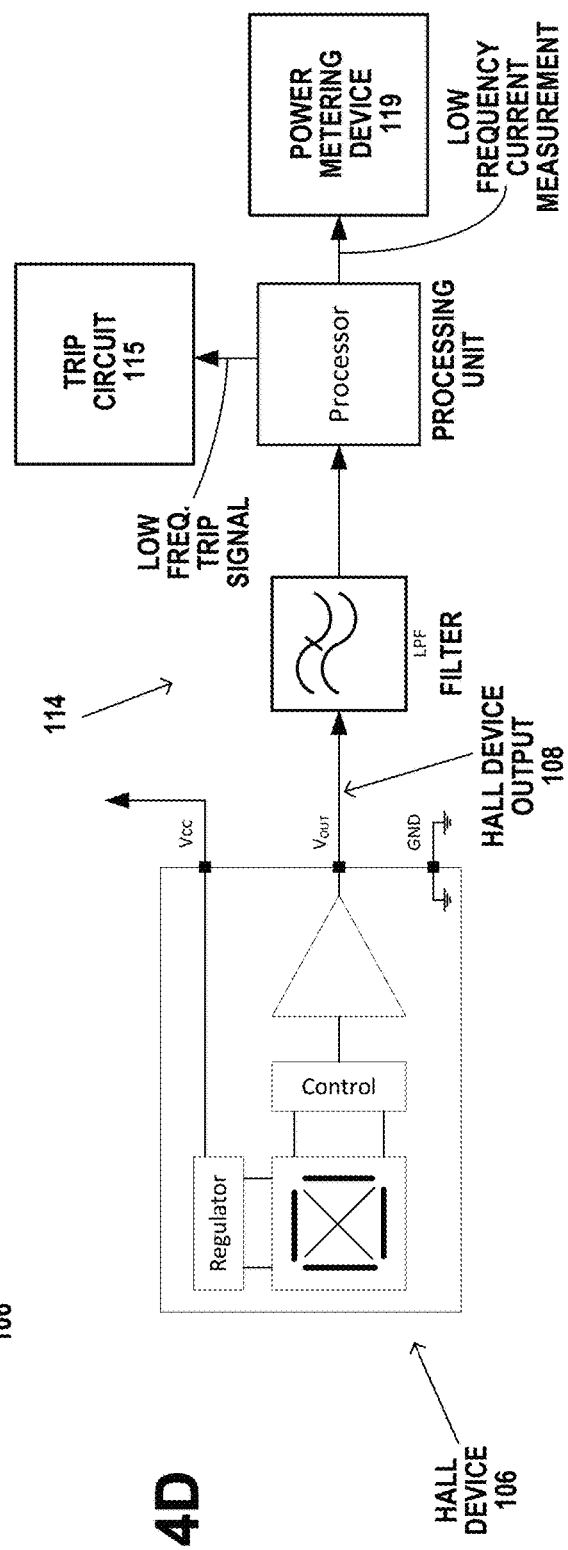
FIG. 4D

B1L – BEAD SENSOR FULL LENGTH CORE
BHL – BEAD SENSOR ½ LENGTH CORE
LIND – REFERENCE SENSOR
13T – SENSOR WITH SECONDARY WINDING
B2L+Hall – BEAD SENSOR WITH DOUBLE LENGTH CORE AND HALL EFFECT DEVICE

COMBINED LOW FREQUENCY AND HIGH FREQUENCY CURRENT SENSOR

BACKGROUND OF THE INVENTION

1. Field of the Invention

The present disclosure relates generally to fault detection in electrical circuits and more particularly to devices to sense both high frequency arc faults and low frequency over-current faults in power lines.

2. Description of Related Art

Arcing faults are commonly defined as current through ionized gas between two ends of a broken conductor in a wire supplying power to a load or at a faulty contact or connector, between two conductors supplying a load, or between a conductor and ground. Arc-faults have high frequency spectral components in the load current signature of an arcing load. Arc-fault circuit interrupter devices include components such as a microprocessor, memory, filters, analog-to-digital converters, and other supporting components to analyze the current and rise-time signals to make a trip decision.

A low cost and small device is very advantageous for accurately detecting arc faults, and also metering power consumption on branch circuits.

BRIEF SUMMARY OF THE INVENTION

In accordance with an example embodiment of the invention, a powdered core bead body, such as a ferromagnetic bead, is configured to become an inductive impedance to current signals with radio frequencies (RF) between 1 MHz to 40 MHz flowing through a power wire passing through the bead. These RF signals passing through this inductive impedance may be measured as a voltage drop between both terminals of the power wire. The impedance increases with the frequency and is proportional with the voltage drop across the terminals. This voltage may be filtered and amplified through an analog front end of an Arc Fault Circuit Interrupter (AFCI) device. The powdered core bead body includes a magnetic flux-density sensing device, such as a Hall-effect device or magnetic field sensor device, embedded in a cavity in the bead body, having a magnetic field sensing surface oriented substantially perpendicular to the circumferential periphery of the bead body. The bead body is configured to provide measurable magnetic flux through the magnetic flux-density sensing device, for currents in the power wire having frequencies in the DC to 20 kHz range. The measurable magnetic flux is detectable by the low frequency magnetic flux-density sensing device, which is configured to output a voltage proportional to the low frequency current amplitude with the same frequency. This low frequency current may be used by an Arc Fault detection algorithm to determine the trip time, for example based on Underwriters Laboratories Inc. (UL) and International Electrotechnical Commission (IEC) standards. Moreover, this low frequency current measurement may be used for power metering devices or to determine power consumption within a protected branch.

In accordance with an example alternate embodiment of the invention, a sensing wire is positioned to pass once through an aperture of the bead body. The sensing wire is configured to sense an occurrence of high frequency current signals in the power wire and to provide an arc fault tripping indication in response to an occurrence of high frequency current signals in the power wire.

The resulting invention provides a smaller and simpler device for both arc-fault detection and over-current protection.

BRIEF DESCRIPTION OF THE DRAWINGS

Example embodiments of the invention are depicted in the accompanying drawings that are briefly described as follows:

FIGS. 1A to 1I illustrate different examples of the combined low frequency and high frequency current sensor, in accordance with the invention.

FIGS. 4A to 4D illustrate the low frequency components of the combined sensor, configured to output low frequency voltage corresponding to the low frequency current for determining tripping times for arc fault detection and metering, in accordance with the invention.

DETAILED DESCRIPTION OF EMBODIMENTS OF THE INVENTION

FIGS. 1A to 1I illustrate examples of a combined low frequency and high frequency current sensor 104 in accordance with the invention.

Figure 1A:
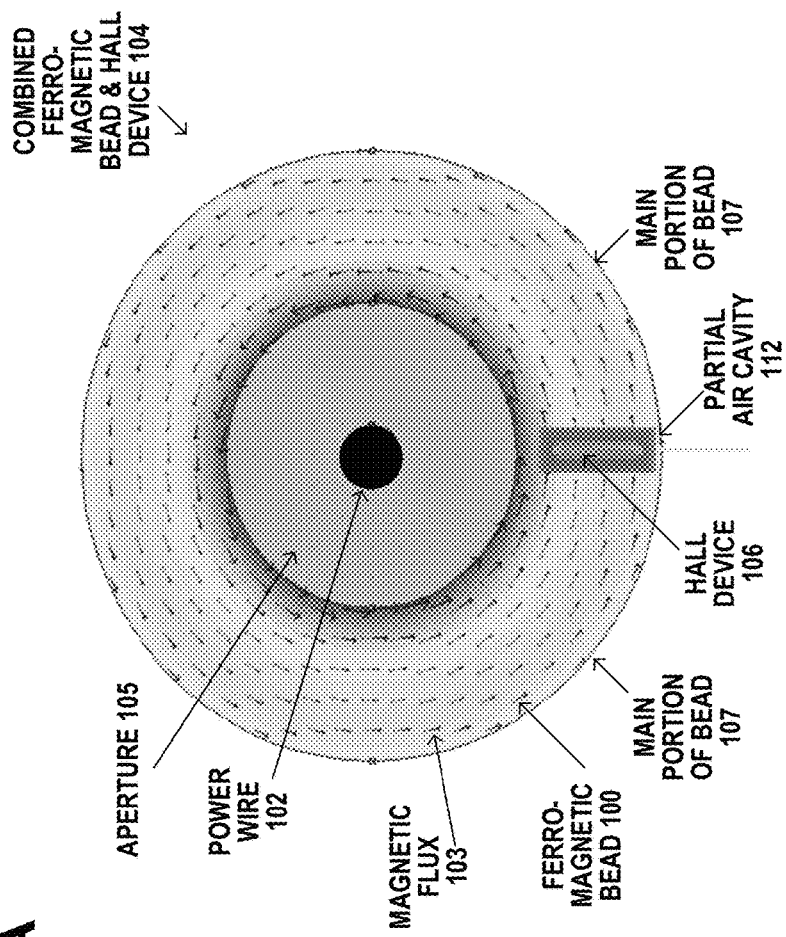

FIG. 1A is a cross sectional view of the combined low frequency and high frequency current sensor 104, in accordance with the invention. A powdered core bead body 100 has a generally cylindrical shape with a centralized circular aperture 105 through the bead body 100. A power wire 102 has a first portion passing into a first end of the aperture 104 (FIG. 1D) and through the bead body 100 and a second portion passing out of a second end of the aperture 105. The powdered core bead body 100 has a low relative magnetic permeability µ=20 up to 120, to minimize saturation by high currents in the power wire. Typical magnetic materials suitable for the powdered core bead body 100 include ferrites and magnetic oxides. Magnetic flux lines 103 shown in FIG. 1A, are directed according to the right-hand rule, in a counter-clockwise direction through the cylindrical body of the ferromagnetic bead 100, produced by an electric current flowing in the power wire 102 and directed out of the page toward the reader.

Figure 1B:
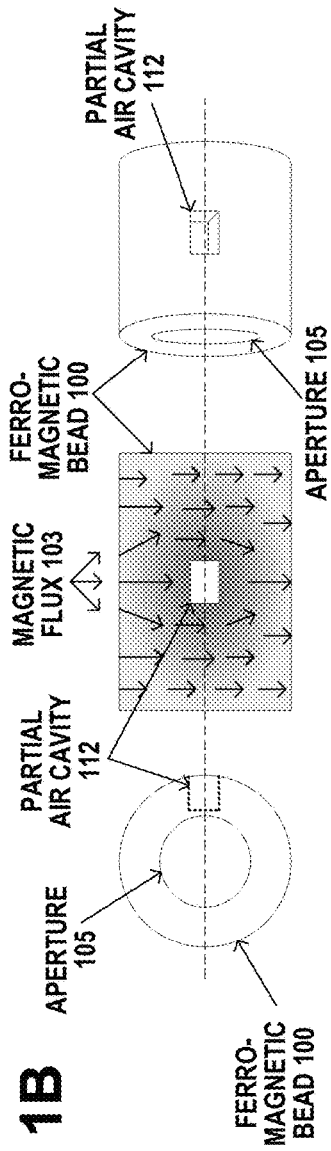
Figure 1C:
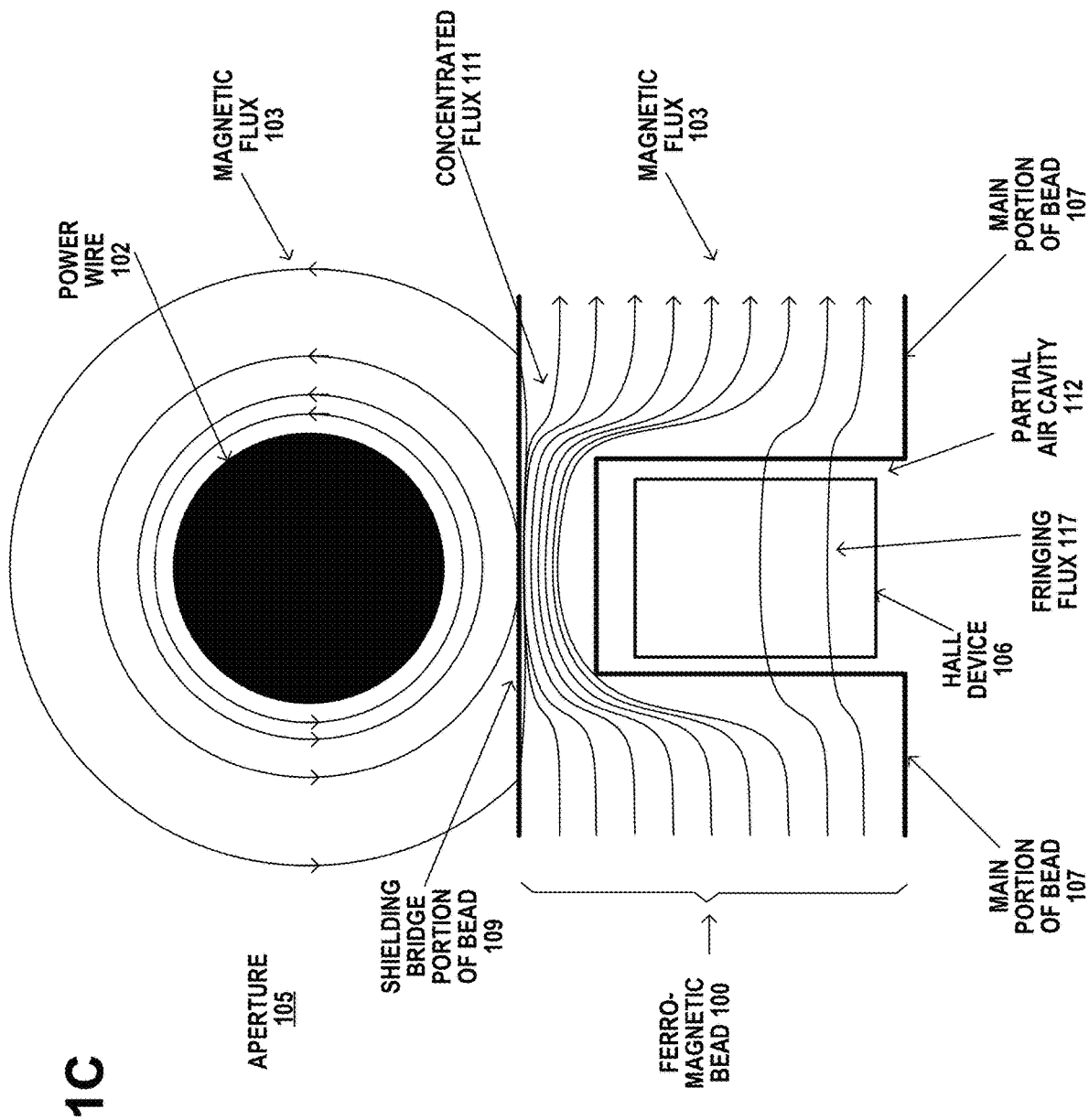
Figure 1D:
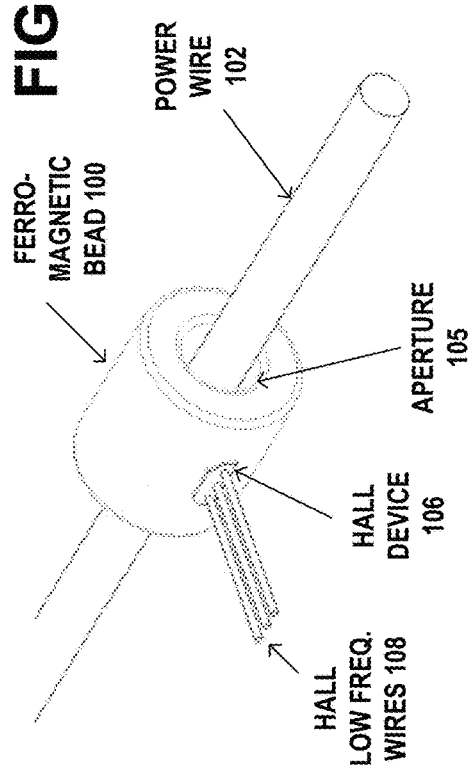
Figure 1E:
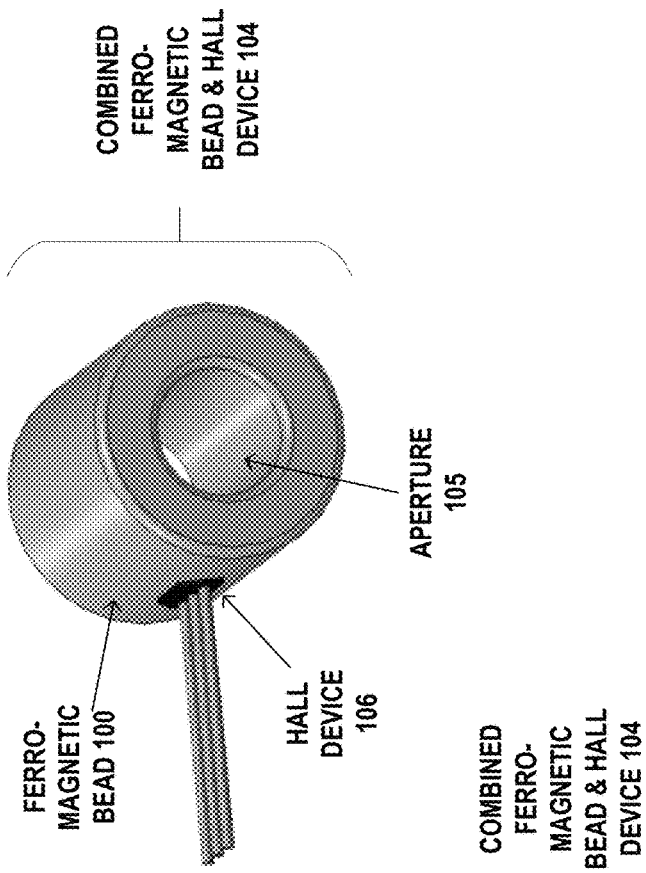
Figure 1F:
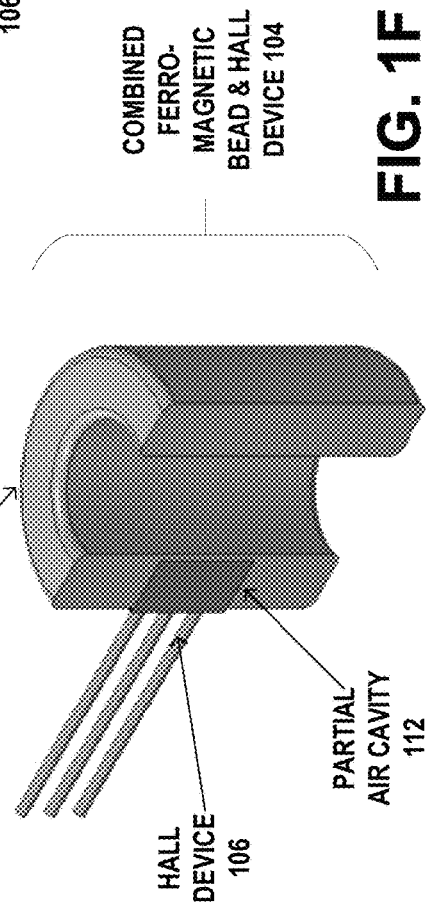
Figure 2A:
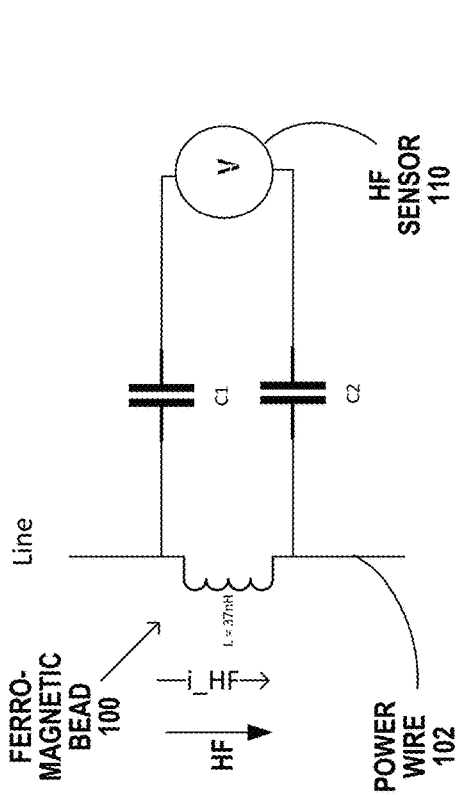
FIGS. 2A to 2C and FIGS. 3A to 3C illustrate the high frequency components of the combined sensor, configured to output high frequency voltage used for determining an arc fault and tripping indication, in accordance with the invention.
Figure 2B:
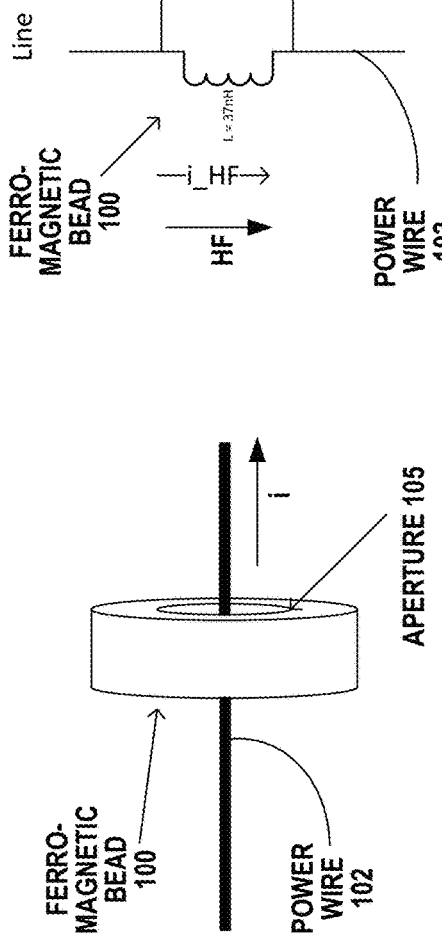
Figure 2C:
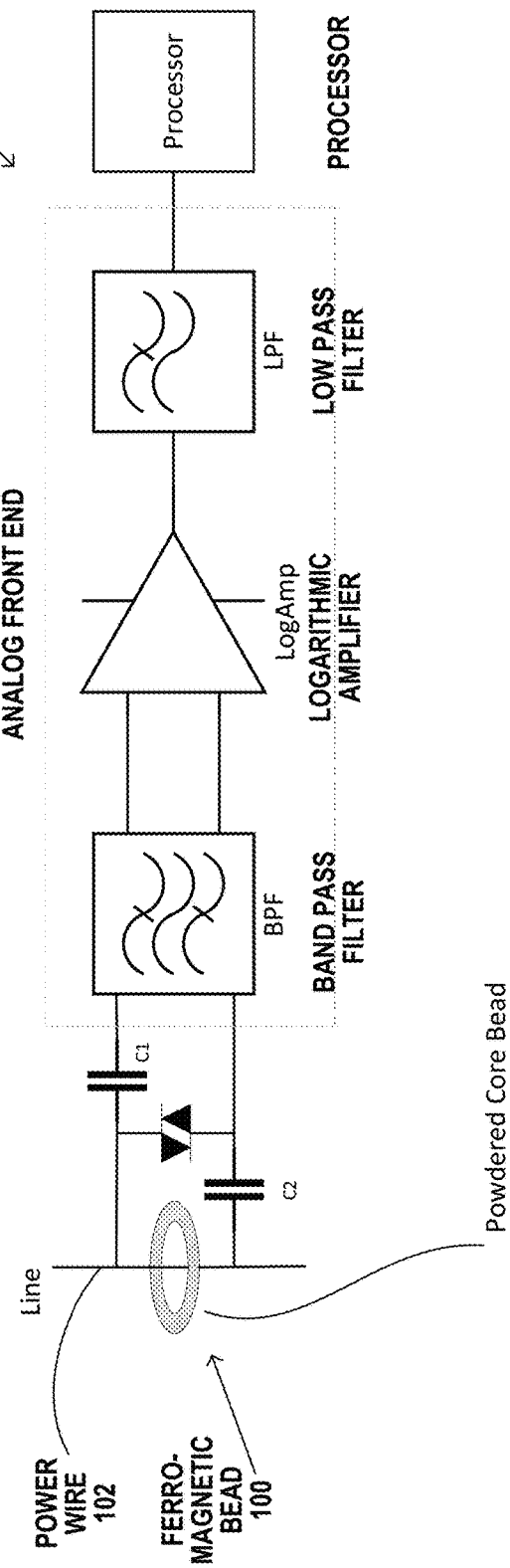

An air cavity is formed in the bead body 100, which may be partially through the cylinder in a radial direction, as shown by the partial air cavity 112 of FIGS. 1A and 1F, or completely through the cylinder in the radial direction, as shown by the through air cavity 113 of FIG. 1H. In the case of either the partial air cavity 112 or the through air cavity 113, the sidewalls of the cavity are substantially perpendicular to the circumferential periphery of the toroid. The cavity 112 or 113 may be formed in the main portion 107 of the bead 100 by various manufacturing processes, such as by molding the powdered core material around an insert having a negative shape of the cavity, or by cutting the cavity into the main portion 107 of the bead 100 by drilling, mechanical machining, or electrical discharge machining.

A magnetic flux-density sensing device 106 is embedded in the partial air cavity 112 or the through air cavity 113 of the bead body 100, having a magnetic field sensing surface oriented substantially perpendicular to the circumferential periphery of the bead body 100. The magnetic flux-density sensing device may be a Hall-effect device, magneto-diode, magneto-transistor, magneto-optical sensor, fluxgate magnetometer, or search coil magnetic field sensor. The sensitivity of the sensor 104 may be controlled by the material of the ferromagnetic bead 100 and its length/size. Most Hall effect sensors 106 have a linear range between a saturating magnetic flux in one direction −Bsat and a saturating magnetic flux in the opposite direction +Bsat. Based on the magnetic flux measurement range required, a Hall-effect sensor 106 outputs a voltage proportional to the magnetic flux corresponding to the low frequency current in the power wire 102.

FIG. 1B shows orthographic projections of the ferromagnetic bead 100 from the left end, front, and right end, showing the partial cavity 112 penetrating partially through the toroidal bead body 100. FIG. 1C shows a magnified, cross sectional view of the relationship of the ferromagnetic bead 100 and the power wire 102 in the aperture 105. The partial cavity 112 shown in FIG. 1C has been formed only partway through the main portion 107 of the ferromagnetic bead 100, leaving a remaining thickness of the ferromagnetic bead 100, referred to here as the shielding bridge portion 109. The magnetic flux-density sensing device 106 or Hall-effect device is embedded within the partial cavity 112. Magnetic flux lines 103 produced by the electric current flowing in the power wire 102, pass into the ferromagnetic bead 100 and are a concentrated magnetic flux 111 in the shielding bridge portion 109. A small portion of the magnetic flux 103 in the main portion 107 of the bead 100 passes as a fringing flux 117 through the partial air cavity 112, which is the magnetic flux incident on and measured by the magnetic flux-density sensing device 106 or Hall-effect device. Due to the concentrated magnetic flux 111 in the shielding bridge portion 109, the shielding bridge portion 109 serves to shield the Hall-effect device 106 from variations in the magnitude of the magnetic flux 103 in the ferromagnetic bead 100, due to variations in the distance of the power wire 102 from the inner edge of the cylinder at the shielding bridge portion 109.

FIGS. 1D, 1E, and 1F show several views of the combined low frequency and high frequency current sensor 104, with the partial air cavity 112. FIGS. 1G, 1H, and 1I show several views of the combined low frequency and high frequency current sensor 104, with the through air cavity 113.

FIGS. 2A to 2C and FIGS. 3A to 3C illustrate the high frequency components of the combined sensor, configured to output high frequency voltage used for determining an arc fault and tripping indication, in accordance with the invention. The ferromagnetic bead 100 becomes an inductive impedance in response to current signals with high frequencies in a power wire 102 passing through the bead 100. This may be used to provide an arc fault tripping indication in response to an occurrence of high frequency current signals in the power wire 102.

A high frequency voltage sensor 110 (FIGS. 2B and 2C) has a first input terminal coupled to the first portion of the power wire 102 and a second input terminal coupled to the second portion of the power wire 102. High frequency current signal may be received by directly connecting to the power wire via isolation capacitors C1 and C2, a diode voltage clamp, and the analog front end (AFE). The analog front end (AFE) includes a band pass filter (BPF), a logarithmic amplifier, a low pass filter (LPF), and a processor for sampling and analyzing the signal using arc fault detection algorithms.

Figure 6:
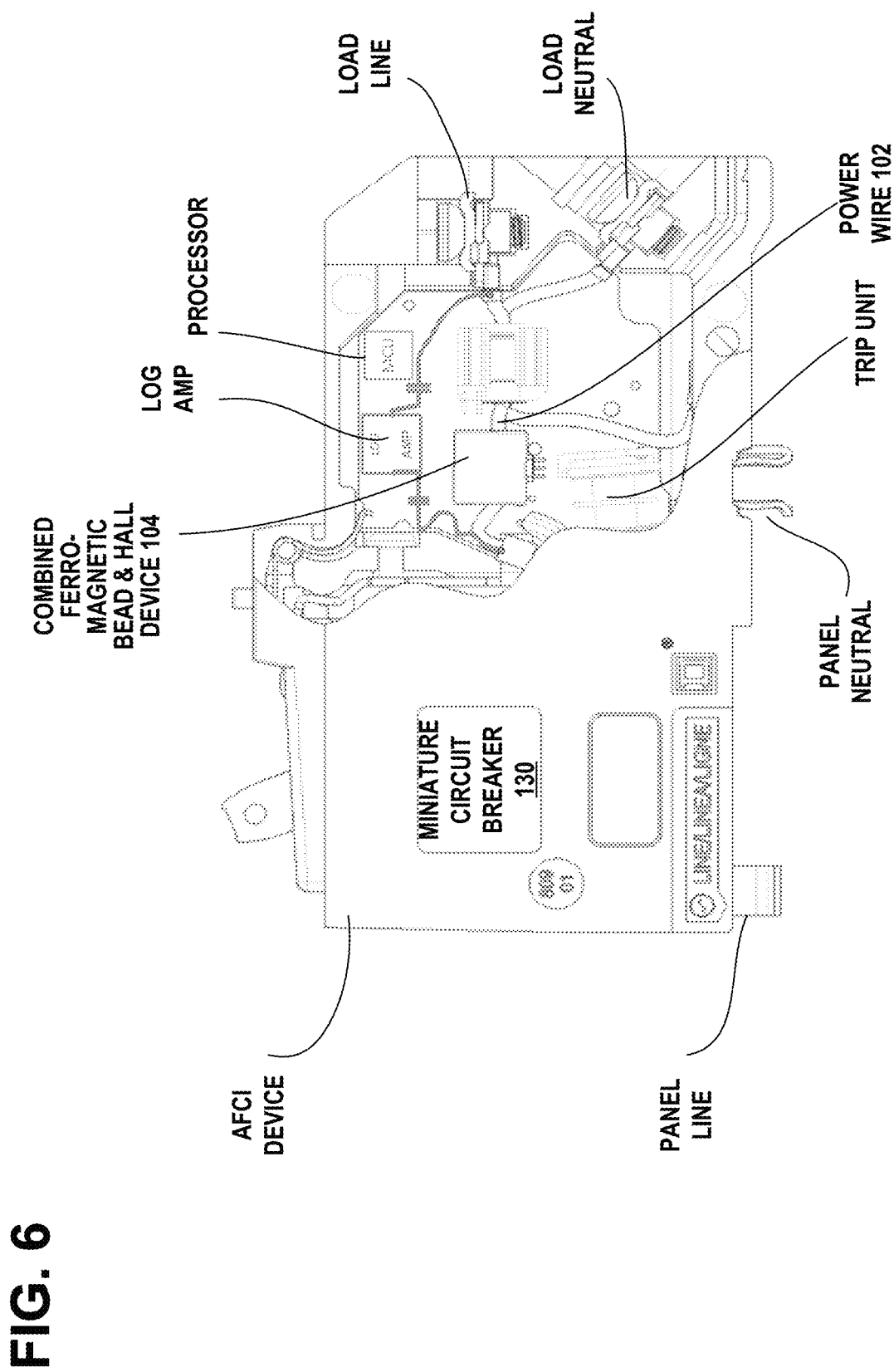
FIG. 6 illustrates an example implementation of the combined low frequency and high frequency current sensor, in accordance with the invention.

An arc fault tripping circuit interrupter (AFCI) in the miniature circuit breaker 130 of FIG. 6, may be configured to interrupt electrical current in the power wire 102, if an output from the high frequency voltage sensor 110 indicates that an arc-fault is detected in the power wire 102; the arc fault tripping circuit interrupter (AFCI) having an input coupled to the high frequency voltage sensor 110.

Figure 3A:
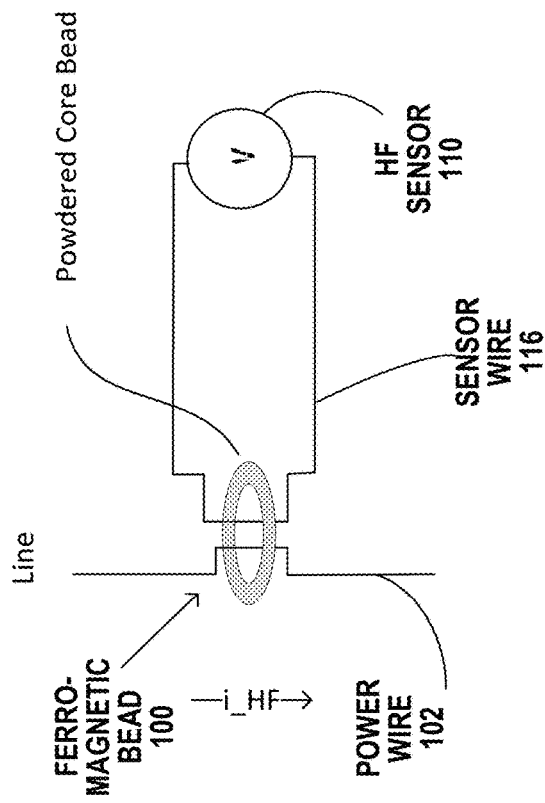
Figure 3B:
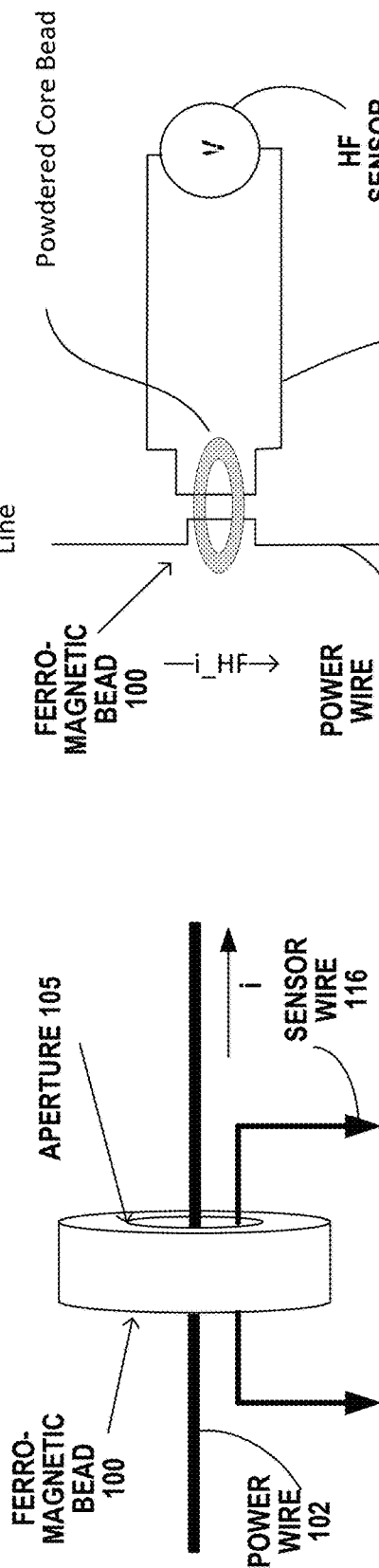
Figure 3C:
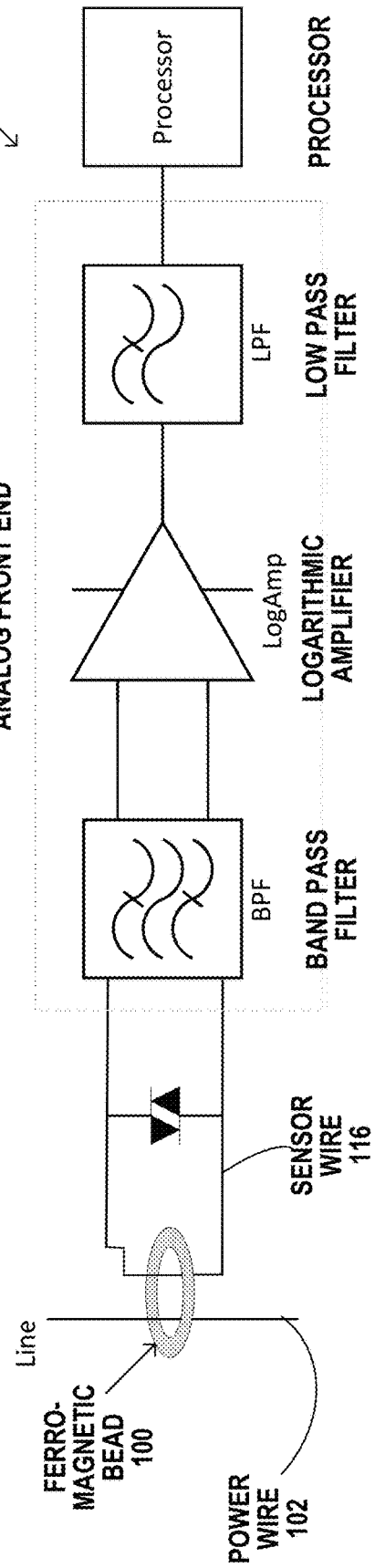

In accordance with an example alternate embodiment of the invention shown in FIGS. 3A to 3C, a sensing wire 116 is positioned to pass once through the aperture 105 of the bead body 100. The sensing wire 116 is effectively a secondary coil for sensing the induced high frequency signals from the power wire 102. The sensing wire 116 is configured to sense an occurrence of high frequency current signals in the power wire 102 and to provide an arc fault tripping indication in response to an occurrence of high frequency current signals in the power wire 102. The high frequency current signal may be received by the sensor wire 116 serving as a single turn secondary loop connected to the analog front end (AFE). High frequency current signal may be received by directly connecting to the sensor wire 116 via a diode voltage clamp and the analog front end (AFE). The analog front end (AFE) includes a band pass filter (BPF), a logarithmic amplifier, a low pass filter (LPF), and a processor for sampling and analyzing the signal using arc fault detection algorithms.

FIGS. 4A to 4D illustrate the low frequency components of the combined sensor, configured to output low frequency voltage corresponding to the low frequency current for determining tripping times for arc fault detection and metering, in accordance with the invention.

The powdered core bead body 100 includes the magnetic flux-density sensing device 106, such as a Hall-effect device or magnetic field sensor device, embedded in the air cavity 112 or 113 in the bead body 100, having a magnetic field sensing surface oriented substantially perpendicular to the circumferential periphery of the bead body 100. The bead body is configured to provide measurable magnetic flux through the magnetic flux-density sensing device 106, for currents in the power wire 102 having frequencies in the DC to 20 kHz range. The measurable magnetic flux is detectable by the low frequency magnetic flux-density sensing device 106 or Hall-effect device, which is configured to output a voltage proportional to the low frequency current amplitude with the same frequency. The Hall-effect device 106 may include regulator, amplifier, and control modules in a large scale integrated circuit. This low frequency current may be used by an Arc Fault detection algorithm to determine the trip time, for example based on Underwriters Laboratories Inc. (UL) and International Electrotechnical Commission (IEC) standards. Moreover, this low frequency current measurement may be used for power metering devices 119 or to determine power consumption within a protected branch.

A low frequency voltage sensor 114 (FIG. 4D) has an input terminal coupled to an output connection of the magnetic flux-density sensing device 106, configured to sense a low frequency variation of the magnetic flux in the bead body 100 sensed by the magnetic flux-density sensing device 106 and to output an indication of an over-current fault in the power wire 102.

The power wire 102 may conduct a principal current that is either an alternating current (AC) or a direct current (DC), for example from a photovoltaic DC power source or DC batteries. The magnetic flux-density sensing device 106 may detect currents in the DC up to 20 kHz range, is embedded into the powdered core bead body 100. The sensor 104 is not restricted to limitations of conventional current transformers (such as Rogowski sensors, or other dI/dt type current sensors), which require an AC current to work.

Figure 5A:
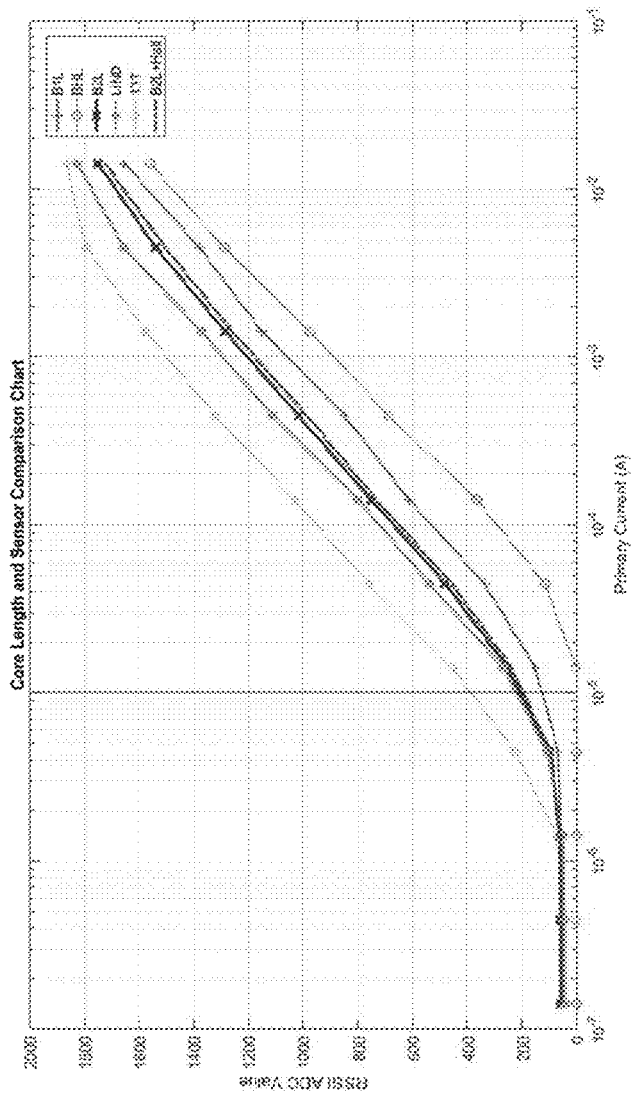
FIG. 5A is a graph illustrating the peak amplitude of demodulated output from high frequency primary current sensing and FIG. 5B is a graph illustrating low frequency sensing from the Hall Effect sensor, in accordance with the invention.

FIG. 5A is a graph illustrating the demodulated output from high frequency primary current sensing in a frequency range of 1 MHz to 40 MHz. The abscissa is the primary current from $10^{-7}$ to $10^{-1}$ Amperes. The ordinate is the RSSI ADC value from 0 to 2000 based on a specific Logarithmic Amplifier and ADC resolution. RSSI stands for Received Signal Strength Indication and ADC stands for Analog to Digital Converter. The traces compare various core lengths and sensor types. In FIG. 5A, B1L stands for BEAD SENSOR FULL LENGTH CORE, BHL stands for BEAD SENSOR ½ LENGTH CORE, LIND stands for a REFERENCE SENSOR, 13T stands for SENSOR WITH A 13 TURN SECONDARY WINDING, and B2L+Hall stands for BEAD SENSOR WITH DOUBLE LENGTH CORE AND HALL EFFECT DEVICE. Note: A full length core is a relative length based on the inductance expected for the sensor to detect frequencies from 1 MHz up to 40 MHz and a certain output level for the logarithmic amplifier input impedance. The graph shows how changing just the length of the core, changes the sensitivity of the RF signal.

Figure 5B:
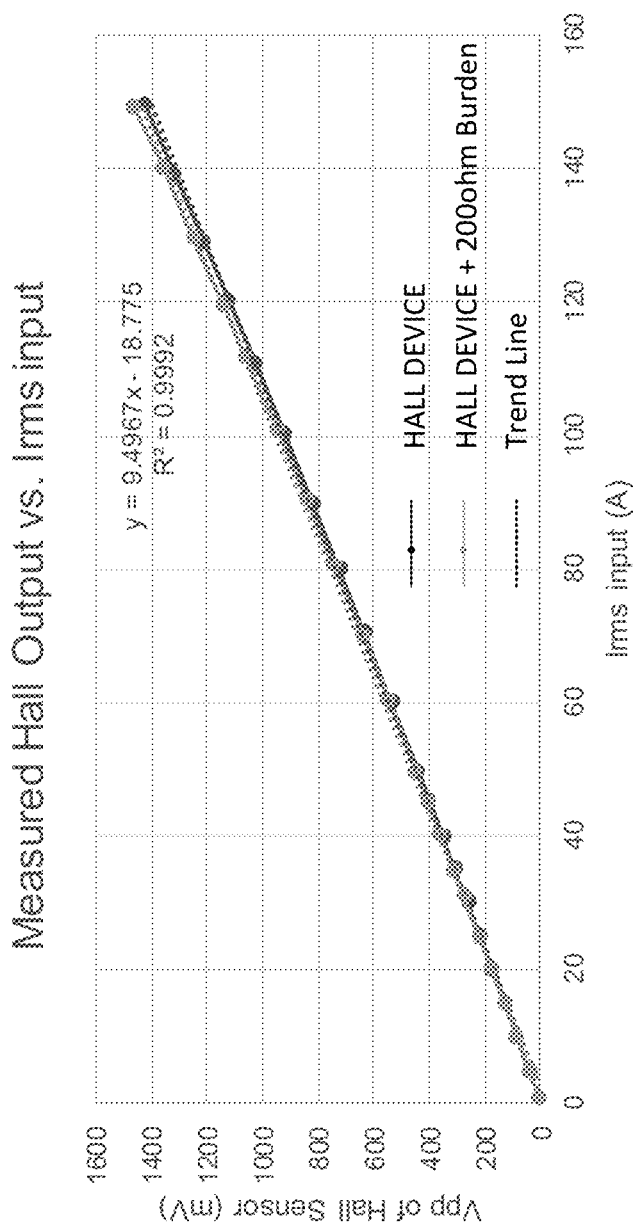

FIG. 5B is a graph of measured Hall output vs. the root mean square (RMS) primary current, illustrating low frequency sensing from the Hall Effect sensor, in accordance with the invention. The abscissa is the root mean square (RMS) primary current I from 0 to 160 Amperes. The ordinate is the maximum peak-peak voltage (Vpp) of the. Hall effect sensor in millivolts from 200 to 1600 mV. The traces compare a Hall-effect device, a Hall-effect device with a 200 Ohm burden, and a trend line.

FIG. 6 illustrates an example implementation of the combined low frequency and high frequency current sensor, in accordance with the invention. A miniature circuit breaker 130 includes the combined low frequency and high frequency current sensor 104. RF signals passing through the inductive impedance of the sensor 104 may be measured as a voltage drop between both terminals of the power wire 102. The impedance increases with the frequency and is proportional with the voltage drop across the terminals. This voltage may be filtered and amplified through an analog front end of an Arc Fault Circuit Interrupter (AFCI) device. The powdered core bead sensor 104 includes a magnetic flux-density sensing device 106, such as a Hall-effect device or magnetic field sensor device, embedded in an air cavity 112 in the bead body 100, having a magnetic field sensing surface oriented substantially perpendicular to the circumferential periphery of the bead body. The bead body is configured to provide measurable magnetic flux through the magnetic flux-density sensing device, for currents in the power wire having frequencies in the DC up to 20 kHz range. The measurable magnetic flux is detectable by the low frequency magnetic flux-density sensing device114, which is configured to output a voltage proportional to the low frequency current amplitude with the same frequency. This low frequency current may be used by an Arc Fault detection algorithm in the AFCI to determine the trip time, for example based on Underwriters Laboratories Inc. (UL) and International Electrotechnical Commission (IEC) standards. The miniature circuit breaker 130 is shown in FIG. 6, including the combined low frequency and high frequency current sensor 104, log amp, processor, load line, load neutral, power wire 102, trip unit, panel neutral terminal, panel line terminal, and AFCI device.

The ferromagnetic powdered core bead body 100 may serve as a magnetic shield for the magnetic flux-density sensing device 106, to protect it from other stray magnetic fields. The shape of the powdered core bead body 100 provides a compact and low cost solution for sensing both high frequency arc faults, low frequency over-current faults, and for low frequency current measurement. The combined low frequency and high frequency current sensor 104 may be readily adapted for implementation in a monolithic solid-state design, which may be used, as an example for fastening to a bus bar.

Among the advantages of the invention, are the following:
Reduced number of sensors for low and high frequency currents:
  a) Single package for two sensors; smaller footprint
Low cost manufacturing sensor:
  a) Solid design;
  b) No winding wires;
  c) Single bead with low relative permeability µ=20 up to 120;
  d) No passive or active integrator circuit required; and
  e) Fast response.
Simplicity in installation, reduced assembly cost:
  a) The bead sensor may be molded to a single core for easy assembly.
Optimization capability for space and sensitivity.
Measurement of low frequency currents down to DC.

Although specific example embodiments of the invention have been disclosed, persons of skill in the art will appreciate that changes may be made to the details described for the specific example embodiments, without departing from the scope of the invention as defined in the attached claims.

The invention claimed is:
1. A combined low frequency and high frequency current sensor, comprising:
  a core bead body composed of a ferromagnetic, ferrite, or magnetic oxide material having a generally toroidal shape with a radial thickness extending between a circumferential periphery and an inner periphery surrounding a centralized circular aperture through which passes a current carrying power wire, and an air cavity formed in the core bead body with sidewalls substantially perpendicular to the circumferential periphery and extending radially inwardly for a distance less than the radial thickness forming a bottom of the cavity separated from the inner periphery of the core bead body surrounding the centralized circular aperture by a remaining thickness of the core bead body forming a shielding bridge portion, configured to provide a magnetic shield for the air cavity from variations in magnetic flux due to variations in distance of the power wire from the inner periphery of the core bead body to enable measurement of magnetic flux in the air cavity; and
  a magnetic flux-density sensing device embedded in the air cavity in the core bead body, having a magnetic field sensing surface oriented substantially perpendicular to the circumferential periphery of the core bead body, configured to measure magnetic flux through the magnetic flux-density sensing device in response to current signals in the power wire.

2. The combined low frequency and high frequency current sensor of claim 1, further comprising:
a sensing wire positioned to pass once through the aperture of the bead body, the sensing wire configured sense an occurrence of high frequency current signals in the power wire and to provide an arc fault tripping indication in response to an occurrence of high frequency current signals in the power wire.

3. The combined low frequency and high frequency current sensor of claim 1, wherein the magnetic flux-density sensing device is a Hall-effect device.

4. The combined low frequency and high frequency current sensor of claim 1, further comprising:
a high frequency voltage sensor having a first input terminal coupled to a first portion of the power wire and a second input terminal coupled to a second portion of the power wire, configured to provide an arc fault tripping indication in response to an occurrence of high frequency current signals in the power wire.

5. The combined low frequency and high frequency current sensor of claim 4, further comprising:
an arc fault tripping circuit configured to interrupt or trip electrical current in the power wire, if an output from the high frequency voltage sensor indicates that an arc-fault is detected, the arc fault tripping circuit having an input coupled to the high frequency voltage sensor.

6. The combined low frequency and high frequency current sensor of claim 1, further comprising:
a low frequency voltage sensor having an input terminal coupled to an output connection of the magnetic flux-density sensing device, configured to sense a low frequency variation of the magnetic flux in the bead body, sensed by the magnetic flux-density sensing device and to output an indication of an over-current fault in the power wire.

7. The combined low frequency and high frequency current sensor of claim 6, further comprising:
an over-current fault tripping circuit configured to interrupt or trip electrical current in the power wire, if an output from the low frequency voltage sensor indicates that an over-current fault or a ground-fault is detected, the over-current fault tripping circuit having an input coupled to the low frequency voltage sensor.

8. The combined low frequency and high frequency current sensor of claim 1, wherein the core bead body is configured to become an inductive impedance to current signals in the power wire with frequencies in the 1 MHz to 40 MHz range.

9. The combined low frequency and high frequency current sensor of claim 1, wherein the core bead body is configured to provide measurable magnetic flux through the magnetic flux-density sensing device, for currents in the power wire having frequencies from DC up to 20 kHz, the measurable magnetic flux being detectable by the low frequency magnetic flux-density sensing device, which is configured to provide a fault tripping indication.

10. The combined low frequency and high frequency current sensor of claim 2, further comprising:
a high frequency voltage sensor having a first input terminal coupled to a first portion of the sensor wire and a second input terminal coupled to a second portion of the sensor wire, configured to sense an occurrence of high frequency current signals in the power wire and to provide an arc fault tripping indication in response to an occurrence of high frequency current signals in the power wire.

11. A low frequency current measurement power metering device, comprising:
a core bead body composed of a ferromagnetic, ferrite, or magnetic oxide material having a generally toroidal shape with a radial thickness extending between a circumferential periphery and an inner periphery surrounding a centralized circular aperture through which passes a current carrying power wire, and an air cavity formed in the core bead body with sidewalls substantially perpendicular to the circumferential periphery and extending radially inwardly for a distance less than the radial thickness forming a bottom of the cavity separated from the inner periphery of the core bead body surrounding the centralized circular aperture by a remaining thickness of the core bead body forming a shielding bridge portion, configured to provide a magnetic shield for the air cavity from variations in magnetic flux due to variations in distance of the power wire from the inner periphery of the core bead body to enable measurement of magnetic flux in the air cavity, having a power wire passing through the bead; and
a magnetic flux-density sensing device embedded in the air cavity in the core bead body, having a magnetic field sensing surface oriented substantially perpendicular to the circumferential periphery of the core bead body, configured to provide measurable low frequency magnetic flux through the magnetic flux-density sensing device in response to current signals with low frequencies in the power wire, the magnetic flux-density sensing device configured to provide low frequency current measurement in response to an occurrence of the low frequency measurable magnetic flux.

12. The low frequency current measurement power metering device of claim 11, wherein the magnetic flux-density sensing device is a Hall-effect device.

13. The low frequency current measurement power metering device of claim 11, further comprising:
a low frequency voltage sensor having an input terminal coupled to an output connection of the magnetic flux-density sensing device, configured to sense a low frequency variation of the magnetic flux in the bead body, sensed by the magnetic flux-density sensing device and to output a low frequency current measurement in response to an occurrence of the low frequency measurable magnetic flux.

14. The low frequency current measurement power metering device of claim 11, wherein the core bead body is configured to provide measurable magnetic flux through the magnetic flux-density sensing device, for currents in the power wire having frequencies between DC and up to 20 kHz, the measurable magnetic flux being detectable by the low frequency magnetic flux-density sensing device, which is configured to provide a low frequency current measurement in response to an occurrence of the low frequency measurable magnetic flux.

* * * * *